United States Patent [19]

Tasch, Jr. et al.

[11] 4,319,260

[45] Mar. 9, 1982

[54] MULTILEVEL INTERCONNECT SYSTEM FOR HIGH DENSITY SILICON GATE FIELD EFFECT TRANSISTORS

[75] Inventors: Al F. Tasch, Jr., Richardson, Tex.; Horng-Sen Fu, Sunnyvale, Calif.

[73] Assignee: Texas Instruments Incorporated, Dallas, Tex.

[21] Appl. No.: 72,803

[22] Filed: Sep. 5, 1979

[51] Int. Cl.³ .................... H01L 29/167; H01L 29/78
[52] U.S. Cl. ........................................ 357/23; 357/54; 357/59; 357/63
[58] Field of Search ........................ 357/52, 54, 23, 24, 357/41, 59, 63

[56] References Cited

U.S. PATENT DOCUMENTS 3,571,914  3/1971  Lands et al. .......................... 357/54
3,798,081  3/1974  Beyer .................................... 357/54
4,013,489  3/1977  Oldham ................................ 357/59

Primary Examiner—William D. Larkins
Attorney, Agent, or Firm—Thomas E. Tyson; Richard L. Donaldson; Melvin Sharp

[57] ABSTRACT

A metal oxide semiconductor device having at least one level of polycrystalline silicon interconnects and novel insulation layers for multilevel interconnects. In one embodiment a layer of arsenic doped glass replaces the conventional phosphorus doped glass insulation layer. In other embodiments a layer of arsenic doped glass upon an undoped layer of silicon dioxide provides the insulation layer. Slow diffusing source-drain impurities along with these insulation layers provide minimum lateral source-drain diffusion.

4 Claims, 6 Drawing Figures

MULTILEVEL INTERCONNECT SYSTEM FOR HIGH DENSITY SILICON GATE FIELD EFFECT TRANSISTORS

BACKGROUND

This invention is directed to methods of making metal-oxide-semiconductor integrated circuits, and structures resulting therefrom, and more particularly to a method of making metal-oxide semiconductor integrated circuits where the sources and drains of the transistors are doped with a slow diffusing impurity, and the multilevel interconnect system insulating layer is arsenic-doped glass or a multilayer structure of phosphorus-doped or arsenic-doped glass upon undoped oxide.

In the fabrication of integrated circuits used primarily for logic applications it is desirable, and the trend has been, to reduce the size of the individual transistor, diode, resistor, etc elements to reduce chip size and/or put more elements on a single chip. At first photolithographic limitations were the sole limiting item in achieving greater packing density. However as photolithographic technology has improved, other factors such as lateral diffusion are becoming important in limiting minimum device sizes. Today transistor gates are 0.3 mils long and the lateral diffusion of sources and drains are 0.04 mils giving a channel length of 0.22 mils. Lateral diffusion now plays an important role in resisting efforts to further reduce device sizes. The present MOS circuits, particularly random access memories (RAMs) and microprocessors, are usually N-channel and fabricated with at least one level of polycrystalline silicon for gates and with phosphorus as the source and drain impurity. The multilevel interconnect system insulating layer is usually phosphorus glass. This fabrication process has problems however when trying to reduce the source and drain lateral diffusion. Phosphorus has a relatively large diffusion coefficient which causes further diffusion of the sources and drains during the high temperatures (typically 950–1000 degrees centigrade) required to cause the multilayer oxide to reflow. These process requirements limit the minimum diffusion depth (and consequently the minimum lateral diffusion) one can achieve.

SUMMARY

The invention is embodied in a method of making MOS integrated circuits having a slow diffusion impurity for the source and drain areas and novel multilevel interconnect system insulating layers. In one embodiment a layer of arsenic-doped glass is deposited on the slice after the last layer of polycrystalline silicon is applied and patterned. The arsenic-doped glass is then reflowed and densified by elevated temperature treatments. In another embodiment, a layer of undoped silicon dioxide is deposited upon the slice after the last layer of polycrystalline silicon is applied and patterned. Then a layer of phosphorus-doped or arsenic-doped glass is deposited upon the undoped oxide. The phosphorus-doped or arsenic-doped glass is subjected to elevated temperatures to reflow and densify the glass. The lower diffusion coefficient of the source-drain and the prevention of phosphorus diffusion from the phosphorus-doped glass allow shallower diffusion depths and less lateral diffusion.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

DETAILED DESCRIPTION

Figure 1:
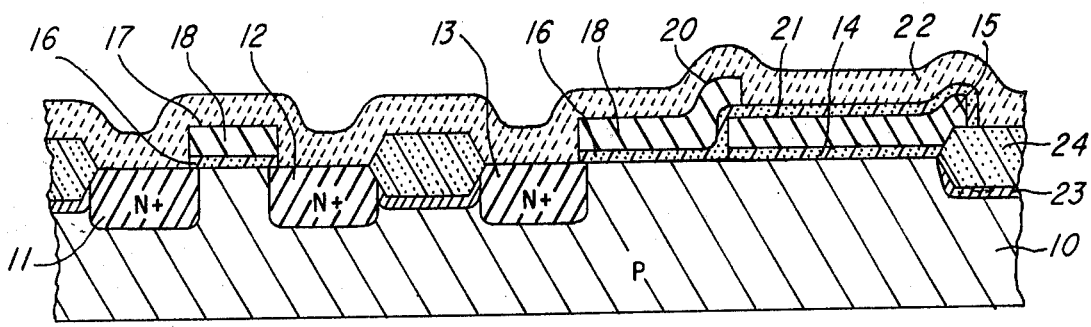
FIG. 1 is a cross-sectional view of an individual MOS transistor and a double level polycrystalline silicon random access memory cell showing one embodiment of the invention.

Referring to FIG. 1, an individual MOS transistor and an MOS random access memory cell comprising an MOS transistor and capacitor are shown in cross section. These elements could be part of a random access memory, a microprocessor, or other similar semiconductor device. The elements are formed in a substrate 10 of semiconductor material of one type conductivity, preferably P-type silicon. A pair of diffused regions 11, 12 of the other conductivity, preferably arsenic although antimony and other slow diffusing impurities could be used, forms the source 11 and drain 12 of the individual transistor. Another diffused region 13 of the other conductivity type forms the drain 13 of the cell transistor. A first insulating layer 14 lies upon the substrate 10 and forms the dielectric of the cell capacitor. A first polycrystalline silicon layer 15 lies upon the first insulating layer 14 to form the top plate 21 of the capacitor. A second insulating layer 16 lies upon the substrate 10 between the source 11 and drain 12 of the individual transistor and in the cell adjacent to the capacitor. Part of the second insulating layer 16 also covers the first polycrystalline silicon layer 15. A conductive member 17, which is part of a second polycrystalline silicon layer 18, covers the part of the second insulating layer 16 lying between the source 11 and drain 12 of the individual transistor and is the gate 17 of the individual transistor. A conductive strip 20 which is part of the second polycrystalline silicon layer 18 lies upon the second insulating layer 16 adjacent to the cell capacitor, and overlaps the top plate 21 of the cell capacitor and the drain of the cell transistor. This strip 20 acts as the gate of the cell transistor and couples the cell transistor to the cell capacitor. An insulating layer 22 of arsenosilicate glass (hereinafter referred to as arsenic-doped glass) overlies all the elements. P-type guard rings 23 are formed in the substrate 10 beneath thick field oxide 24 which surrounds the individual transistor and the memory cell.

Figure 2:
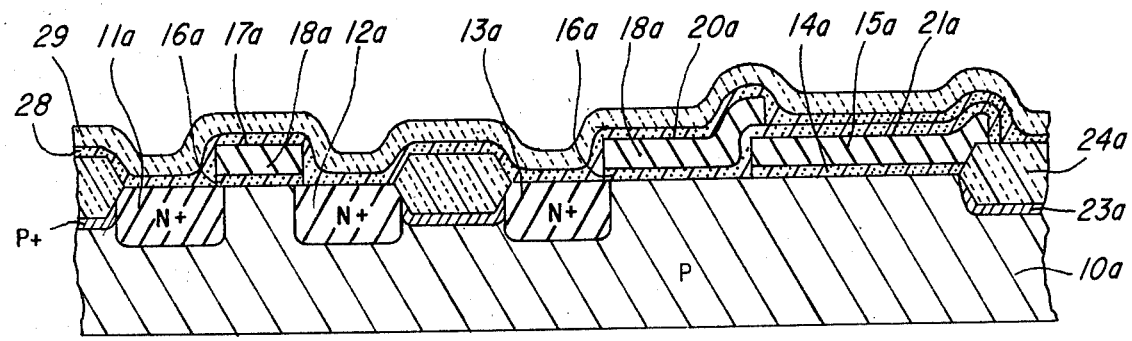
FIG. 2 is a cross-sectional view of the device of FIG. 1 showing another embodiment of the invention.

Referring to FIG. 2, second and third embodiments of the invention described in FIG. 1 are shown. In the embodiments of FIG. 2 an insulator comprising a layer 29 of phosphosilicate glass (hereinafter referred to as phosphorus-doped glass) or arsenic-doped glass upon a 500-1000 Angstrom thick layer 28 of silicon oxide replaces the arsenic-doped glass insulating layer 22 of FIG. 1. It will be understood that the numbers with the "a" subscript in FIG. 2 refer to the same elements that the numbers without the subscript refer to in FIG. 1, and therefore the previous description of these elements in FIG. 1 applies to FIG. 2.

Figure 3:
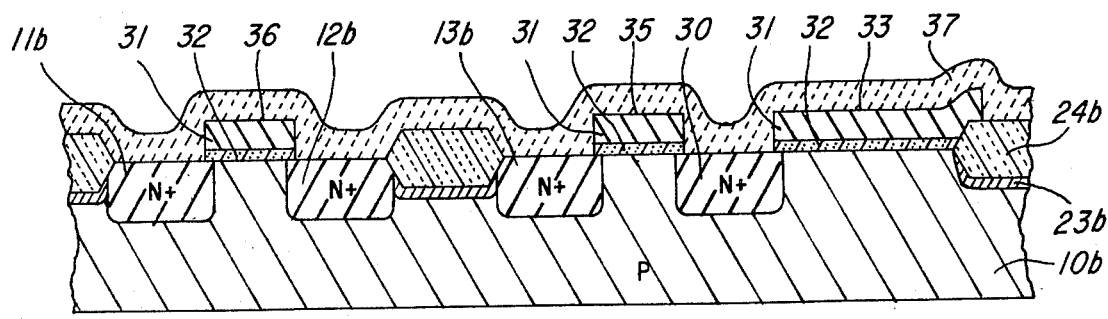
FIG. 3 is a cross-sectional view of an individual MOS transistor and a single level polycrystalline silicon random access memory cell showing one embodiment of the invention.

With reference to FIG. 3, an individual MOS transistor and an MOS random access memory cell comprising an MOS transistor and capacitor are shown in crosssection. This memory cell and transistor are similar to the structures in FIGS. 1 and 2 with the difference being that here the cell transistor has a diffused source 30 and only one layer 31 of polycrystalline silicon is used. It will be understood that the numbers with the "b" subscript in FIG. 3 refer to the same elements without the subscripts in FIG. 1. A diffused source 30 of the other type conductivity, preferably arsenic or antimony, is formed at the same time as the drain 13b. An insulating layer 32 upon the substrate 10b provides the dielectric for the cell capacitor and provides the gate dielectric for the individual transistor and cell transistors. It lies upon the substrate surface and between the respective source 11b, 30 and drains 12b, 13b. A single layer 31 of polycrystalline silicon provides the top plate 33 of the capacitor, the gate 35 of the cell transistor and the gate 36 of the individual transistor. An arsenic-doped glass insulating layer 37 overlies all of the elements.

Figure 4:
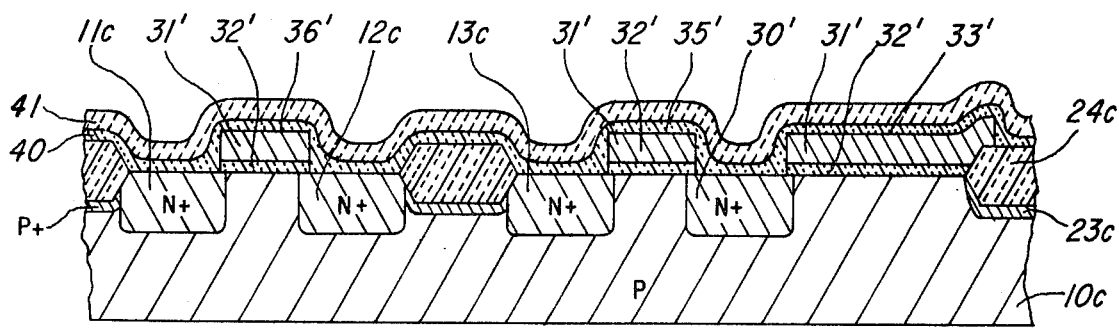
FIG. 4 is a cross-sectional view of the device of FIG. 3 showing another embodiment of the invention.

Referring to FIG. 4, other embodiments of the invention described in FIG. 3 are shown, the only difference between the two is that here the arsenic-doped glass insulating layer 37 shown in FIG. 3 is replaced with an insulator comprising a layer 41 of phosphorus-doped glass or arsenic-doped glass upon a 500-1000 Angstrom thick layer 40 of silicon oxide. It will be understood that the numbers with the "c" subscript in FIG. 4 refer to the elements in FIG. 1 without the subscripts, and the numbers with the primes in FIG. 4 refer to the same elements in FIG. 3 without primes and without subscripts.

Figure 5A:
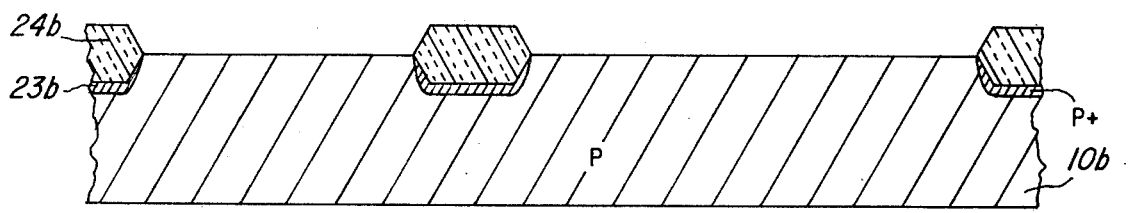
FIGS. 5a–5b are cross-sectional views of the device of FIG. 3 at successive stages in the manufacturing process.
Figure 5B:
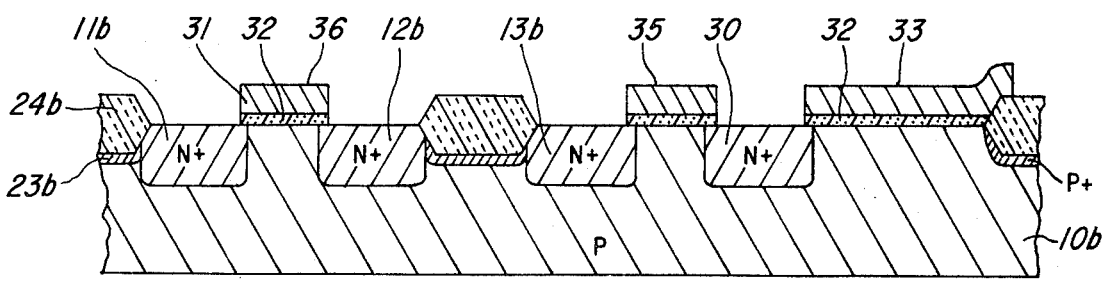

Referring to FIG. 5a-5b and FIG. 3, a process for making the memory cell of FIG. 4 will be described, with emphasis being placed on the process steps dealing with the multilevel interconnect system insulator and source-drain formation. The starting material is a monocrystalline semiconductor substrate 10b, preferably P-type silicon although N-type semiconductors could be used with appropriate changes in the type conductivity of other monocrystalline semiconductor regions. A thin layer of silicon dioxide is grown upon the substrate 10c, followed by the deposition of a silicon nitride layer. The oxide and nitride layers are patterned using conventional photolithographic techniques leaving silicon 10b exposed in areas where the guide ring inplant is desired. The slice 10c is subjected to a boron implant followed by a long oxidation to form the diffused guard rings 23b beneath thick field oxide 24b as shown in FIG. 5a. The nitride and thin oxide layers are removed followed by the growth of a thin oxide layer 32 upon which a layer 31 of polycrystalline silicon is deposited. The polycrystalline silicon 31 will form the gates and gate interconnects. The polycrystalline silicon layer 31 and the thin oxide layer 32 are patterned leaving bare silicon 10b where the source-drain areas 11b, 12b, 13b, 30 are desired. The source-drain areas 11b, 12b, 13b, 30 are formed preferably by the implant of arsenic into the substrate 10b, although antimony and perhaps other slow diffusing N-type impurities could be used. The implant is very shallow, perhaps 0.3-0.5 microns, so that small source to drain spacings may be used to give higher packing density.

The next step is the formation of the multilevel interconnect system insulator. An arsenic-doped glass (As$_2$O$_3$.SiO$_2$) layer 37 is deposited upon the slice as shown in FIG. 3. This arsenic-doped layer 37 is really a composition of silicon dioxide, (SiO$_2$) and arsenic trioxide (As$_2$O$_3$) formed by a low temperature (approximately 500 degrees C.) deposition using silane (SiH$_4$), oxygen (O$_2$) and aresine (AsH$_3$). After the arsenic-doped layer 37 is deposited, the slice is placed in a high temperature furnace at about 850-900 degrees C to reflow the layer 37 and give the surface of the slice 10B a smoother topology. In the double level polycrystalline silicon device of FIG. 1, an arsenic-doped glass layer 22 is used as the insulating layer. However, here the layer 22 is not formed until after the second layer 18 of polycrystalline silicon is applied and patterned.

FIG. 4 shows the device of FIG. 3 with a different type of multilevel interconnect system insulator, as previously described. To form the multilevel interconnect system insulator of FIG. 4, first deposit a layer 40 of undoped silicon dioxide followed by the deposition of a layer 41 of phosphorus-doped glass or arsenic-doped glass. Both the doped and undoped layers can be formed by low temperature (approximately 500 degrees C.) operations such as that earlier described for forming arsenic-doped glass. Either of these combination multilayer oxides is then reflowed by high temperature treatment, usually at about 1000 degrees C. for phosphorus-doped glass and at about 850-900 degrees C. for arsenic-doped glass. In the double level polysilicon device of FIG. 2 the multilevel interconnect system insulator is the same as that used in FIG. 4. However, in FIG. 2 it is not formed until after the second layer of polycrystalline silicon is applied and patterned.

During the high temperature reflow step with any of the three previously described multilevel interconnect system insulators, the slices may be removed from the furnace tube while P$_2$O$_5$ is being formed in the furnace tube, as when POCl$_3$, O$_2$ and N$_2$ are flowing in the tube. The deposition of P$_2$O$_5$ during the reflow step helps to improve the contour of the contacts subsequently etched in the insulator.

After the multilevel interconnect system insulator is formed, it is patterned and etched with the contact pattern. Metal is applied and patterned completing fabrication of the device.

In efforts to scale down devices for achieving higher packing density in integrated circuits, the lateral diffusion of the source and drain regions becomes an important factor. In today's technology the gates are 0.3 mil long and the lateral diffusion of the sources and drains is about 0.04 mils each leaving a channel length of 0.22 mils. As gate lengths continue to decrease it is obvious the lateral diffusion of the sources and drains will also have to decrease. The advantages of arsenic, antimony, or other slow diffusing N-type impurities over phosphorus in reducing lateral diffusion are several. One is that phosphorus has a larger diffusion coefficient than the others so that heat treatments subsequent to the source-drain diffusion will cause greater diffusion of the phosphorus sources and drains than with the others. Another advantage is that arsenic causes minimum lattice damage at higher concentrations so that shallower, higher concentration source-drain diffusions can be used. (In the following discussion only arsenic will be compared with phosphorus although the comparison is valid for the other N-type impurities mentioned.) However, the substitution of arsenic for phosphorus without other changes will not result in any improvement over present processing techniques. During the densification and reflow of a phosphorus-doped glass multilevel interconnect system insulator, phosphorus will diffuse out of the glass and into the silicon past the previously formed arsenic diffused sources and drains, thereby negating the effect of the shallower arsenic diffusion. The methods of the present invention eliminate this problem. The structures of FIGS. 1 and 3 use an arsenic-doped glass layer in place of the conventional phosphorus-doped glass. Here any diffusion of impurity (arsenic) from the glass into the silicon during the densification and reflow step will only be arsenic and will not diffuse past the pre-existing source and drain areas. Therefore the channel length will be determined by the diffused source and drain areas and not be a subsequent unintentional diffusion of impurities.

The structures of FIGS. 2 and 4 use an approach which eliminates any diffusion of impurities from the glass during the densification and reflow step. A layer 28, 40 of undoped silicon oxide is deposited upon the slices followed by the deposition of the phosphorus-doped glass or arsenic doped glass layer 29, 41. Here any diffusion of phosphorus or arsenic from the glass layer 29, 41 is blocked by the undoped layer 28, 41. The result again is that the channel length will be determined by the diffused source and drain areas and not by a subsequent unintentional diffusion of impurities.

Although the invention has been described basically with respect to N-channel devices, these multilayer oxides could be used to minimize the lateral diffusion of p-channel devices, even where boron is the p-type impurity.

What is claimed is:

1. A semiconductor device comprising:
   a semiconductor body of P type conductivity; a pair of N type regions in said body and adjacent to the surface of said body, said regions being doped with slow diffusion impurity; an insulating layer upon said surface, disposed between and partially overlapping said regions; a conductive member upon said first layer partially overlapping said regions; and a multilevel interconnect system insulating layer of arsenic doped glass upon a layer of silicon dioxide upon said conductive member and said regions wherein said layer of silicon dioxide acts as a barrier to diffusion of arsenic from said arsenic glass.

2. A device according to claim 1, wherein said conductive member is a polycrystalline silicon.

3. A device according to claim 1, wherein said pair of N type regions include arsenic.

4. A device according to claim 1, wherein said pair of N type regions include antimony.

* * * * *